(12) United States Patent
Hollmer et al.

(10) Patent No.: US 6,472,898 B1
(45) Date of Patent: Oct. 29, 2002

(54) METHOD AND SYSTEM FOR TESTING A SEMICONDUCTOR MEMORY DEVICE

(75) Inventors: Shane Hollmer, San Jose, CA (US); Santosh Yachareni, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 14 days.

(21) Appl. No.: 09/718,986

(22) Filed: Nov. 22, 2000

Related U.S. Application Data (60) Provisional application No. 60/249,924, filed on Nov. 16, 2000.

(51) Int. Cl.[7] .............................................. G01R 31/26
(52) U.S. Cl. .................................... 324/765; 324/158.1
(58) Field of Search ................................ 324/765, 766, 324/158.1; 341/118–120, 122, 131, 110; 365/185.14, 185.23, 230.02, 240

(56) References Cited

U.S. PATENT DOCUMENTS

| | | | | |
|---|---|---|---|---|
| 4,528,503 A | * | 7/1985 | Cole | 324/766 |
| 5,175,547 A | * | 12/1992 | Lyon et al. | 324/548 |
| 5,508,971 A | * | 4/1996 | Cernea et al. | 365/185.14 |
| 5,546,079 A | * | 8/1996 | Wagner | 307/125 |
| 6,016,113 A | * | 1/2000 | Binder | 341/120 |

\* cited by examiner

Primary Examiner—Michael Sherry
Assistant Examiner—Minh N. Tang (57) ABSTRACT

A method and system for testing a semiconductor memory device applies defined test voltages to a semiconductor memory device in a manner that minimizes a time lapse during shifting from one voltage level to another or one voltage range to another. The system includes registers for storing codewords. Each codeword represents a discrete voltage level. The registers have inputs and outputs. Digital-to-analog converters are coupled to the outputs of the registers for converting a codeword into a corresponding analog voltage with a discrete voltage level. A multiplexer derives a test output voltage from the analog voltage, an external voltage, or both. A mode controller controls the multiplexer to derive the test output voltage. The test output voltage is compliant with defined voltage ranges associated with corresponding modes.

20 Claims, 12 Drawing Sheets

METHOD AND SYSTEM FOR TESTING A SEMICONDUCTOR MEMORY DEVICE

This document claims the benefit of U.S. Provisional Application Ser. No. 60/249,924, filed on Nov. 16, 2000 and entitled METHOD AND SYSTEM FOR TESTING A SEMICONDUCTOR MEMORY DEVICE, under 35 U.S.C. 119(e), which is incorporated herein by reference.

FIELD OF THE INVENTION

This invention relates to a method and system for testing a semiconductor memory device.

BACKGROUND

Semiconductor manufacturers may test the reliability of a semiconductor memory device by varying a test voltage applied to the semiconductor device over a voltage range during a test period. A cycle represents a transition of the test voltage across an entire voltage range. By varying the voltage over many cycles (e.g., greater than 100,000 cycles), the longevity of the semiconductor device may be measured. The variation of the voltage over many cycles in a controlled environment may be referred to as an accelerated life test of the semiconductor memory device.

A typical accelerated life test for semiconductor memory device, such as flash memory, involves testing for proper operation of the semiconductor memory device during program-erase voltage cycles and read voltage cycles. A total cycle duration equals the sum of a duration of one program-erase cycle, a duration of one read voltage cycle, and any intervening time between the different voltage cycles. The intervening time in the total cycle duration may be based on a typical switching speed of a conventional commercially available test fixture or a power supply where the power supply switches from a program-erase voltage level to a read voltage level. Data is written into the memory and read from the semiconductor memory device to verify proper data storage and retrieval operation.

A typical test fixture may require more than 217 days to test a one Megabyte memory device over 100,000 cycles. If each total cycle takes a total cycle duration $c_t$ (e.g., 3 milliseconds) to complete and if n (e.g., 100,000 cycles) cycles are executed, the accelerated life test would take a total duration of $c_t$ n (m/s) for a flash memory, where m is the total storage size of the memory in bytes and s in the memory sample size serviced per one total cycle duration.

The semiconductor manufacturer may not wish to ship semiconductor memory devices until proper testing is complete to assure shipment of a reliable product. If a semiconductor manufacturer could reduce the testing duration for accelerated life tests, the semiconductor manufacturer might realize improved responsiveness to customer demand for the semiconductor devices, reduced pressure to maintain inventory of the semiconductor devices to meet tight shipment schedules, and reduced manufacturing costs. Thus, a semiconductor manufacturer has a need for reducing the testing time associated with testing (e.g., accelerated life tests) of semiconductor memory devices, such as flash memory.

SUMMARY OF THE INVENTION

In accordance with the invention, a method and system for testing a semiconductor memory device applies defined test voltages to a semiconductor memory device in a manner that minimizes a time lapse during shifting from one voltage level to another or one voltage range to another. The system includes registers for storing codewords. Each codeword represents a discrete voltage level. The registers have inputs and outputs. Digital-to-analog converters are coupled to the outputs of the registers for converting a codeword into a corresponding analog voltage with a discrete voltage level. A multiplexer derives a test output voltage from the analog voltage, an external voltage, or both. A mode controller controls the derivation of the test output voltage by the multiplexer. The test output voltage is compliant with defined voltage ranges associated with corresponding modes.

In accordance with one aspect of the invention, the test device provides test voltages over three discrete ranges, including an erase mode range, a program mode range, and read mode range, in rapid succession. In accordance with another aspect of the invention, variations in the voltage within each range may be programmed as a discrete sequence or pattern of voltage steps with a resolution determined by a register controller and a digital-to-analog converter. The time for changing from one voltage step to another within a range is generally uniform. Further, the transition time from one mode range to another is minimized by using multiple, analog-to-digital converters in a coordinated manner to reduce the total time necessary to conduct testing (e.g., an accelerated life test) of a semiconductor memory device.

BRIEF DESCRIPTION OF THE DRAWINGS

Like reference numbers indicate like elements throughout the above drawings.

DETAILED DESCRIPTION OF THE PREFERRED EMBODIMENTS

Figure 1A:
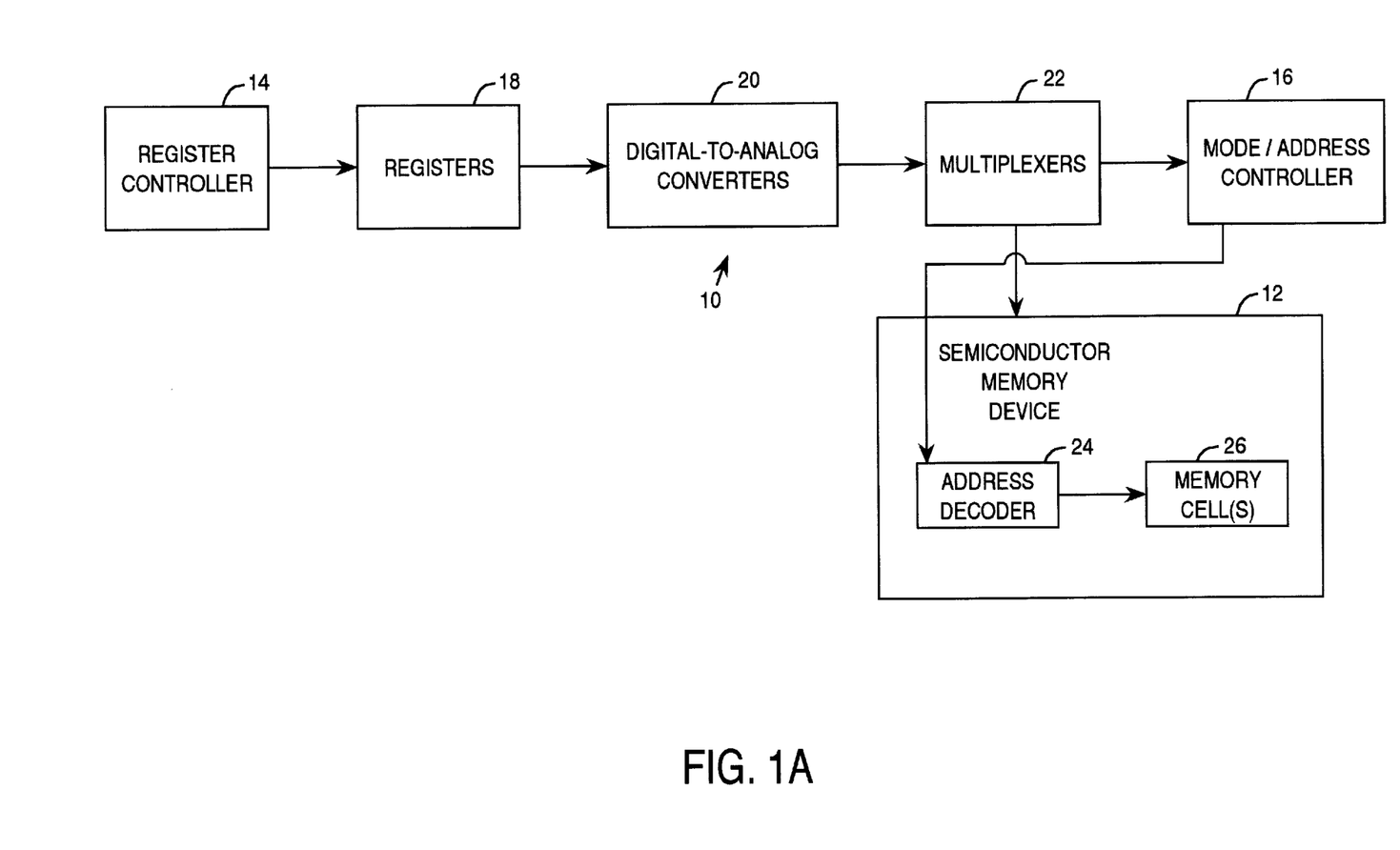
FIG. 1A is a general block diagram of a test system in accordance with the invention.

FIG. 1A shows a register controller 14 coupled to registers 18 in accordance with the invention. The registers 18 have inputs and outputs. The inputs receive codewords that represent discrete voltage levels. A codeword is a set of symbols, bits, or bytes. The outputs of the registers 18 are coupled to digital-to-analog converters 20. In turn, outputs of the digital-to-analog converters 20 are coupled to data input terminals of multiplexers 22. A mode/address controller 16 controls the operation of the multiplexers 22 such that at least one of the multiplexers 22 provides a test output voltage or test output voltages to the semiconductor memory device 12. In one embodiment, the mode/address controller 16 determines a level of at least one test output voltage based on one or more of the following voltages: an analog voltage output of the digital-to-analog converter and an external voltage level. The test output voltage or test output voltages are provided to a semiconductor memory device 12 for conducting an accelerated life test, a performance test, or a reliability test.

A register controller 14 provides codewords for input into the registers 18 and controls the loading of the codewords into the inputs of the corresponding registers 18. The register controller 14 is programmed to provide a desired sequence or pattern of codewords over time such that the test system 10 produces a desired sequence or pattern of output test voltages for application to the semiconductor memory device 12. The register controller 14 may limit the data transmission rate of the codewords to coincide with a storage capacity of a register 18 and a processing speed of the associated digital-to-analog converter 20. The desired sequence or pattern may be selected to stress a semiconductor memory device 12 in accordance with a preferential sequence of voltage variations.

The register controller 14 provides a control signal to the registers 18 to control the synchronization of the contents of the registers 18 and updates to the contents of the registers 18. The control signal may be expressed as a pulse train or a triggering edge of a pulse at the appropriate time to store, update, or hold the contents of a storage array in a register 18.

Flip-flops (e.g., D flip-flops) may be combined to form a single register 18 with multiple input data terminals (e.g., 6 bit capacity) and output data terminals. The clock inputs of the flip-flops that form a register 18 are synchronously fed by a common clock signal. One or more clock pulses may move a codeword from the data input terminals to the data output terminals of the register 18. A register 18 may be configured as a transparent latch or an edge-triggered latch. A transparent latch may provide a quicker data output, than an edge-triggered latch, which may be used to reduce the time delay in shifting from one test voltage to another.

The digital-to-analog converter 20 may comprise any digital-to-analog converter (DAC) with a suitable conversion rate and data capacity. For example, a suitable conversion time generally does not exceed a maximum duration that is consistent with meeting a maximum total test period for an accelerated life test of a semiconductor memory device 12. The conversion rate of the digital-to-analog converter 20 determines the delay from switching between one test output voltage and another test output voltage within the same mode (e.g., first mode or the second mode). Accordingly, any sequence or pattern of possible levels within a mode may be programmed flexibly to place a desired stress on the semiconductor memory device 12 without materially affecting the testing time within a mode (e.g., first mode). In one embodiment, the register controller 14 cooperates with the digital-to-analog converter 20 to change the test voltage output from one voltage step to another in approximately two hundred nanoseconds or less.

Figure 3:
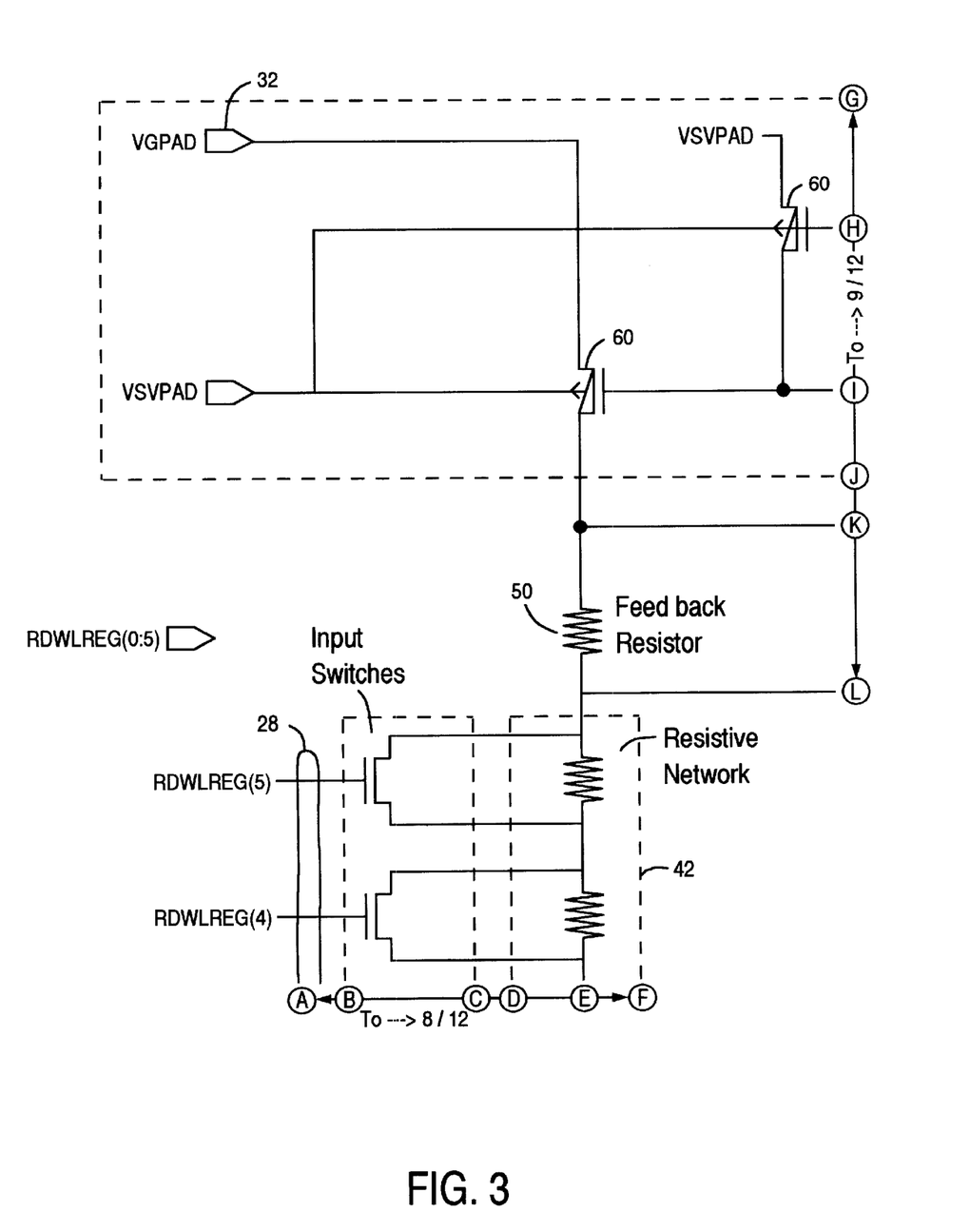
FIG. 3 is a schematic diagram of an illustrative digital-to-analog converter that may be used in the test system of FIG. 1A and FIG. 1B.

The digital-to-analog converter 20 may be one of several different alternative designs, including a multiplying DAC, a zero-hold DAC, a DAC of FIG. 3, or some variation of the foregoing DAC's. For a multiplying digital-to-analog converter, the output is the product of the input current or input voltage and an inputted digital codeword. Advantageously, a multiplying digital-to-analog converter may have a settling time of 100 nanoseconds or less. A zero-order-hold digital-to-analog converter is one example of a commercially available multiplying digital-to-analog converter.

The multiplexer 22 contains semiconductor switches, which may be arranged to form a switching matrix. In one embodiment, the switching matrix may selectively interconnect a selected input of the multiplexer 22 to an output of multiplexer 22.

The mode/address controller 16 determines the active switching state of the multiplexer 22, which in turn determines the mode of operation of the test system 10. In one embodiment, the register controller 14 and the mode/address controller 16 may represent a data processing system, such as a computer with appropriate software instructions for providing codewords to the registers 18 and control data to the registers 18 and the multiplexers 22.

In an alternate embodiment, the switching matrix may feed multiple inputs of the multiplexer 22 to a combiner or summer. The summer sums the individual levels of input voltages. The summed input voltages are provided as the output of the multiplexer 22.

Figure 1B:
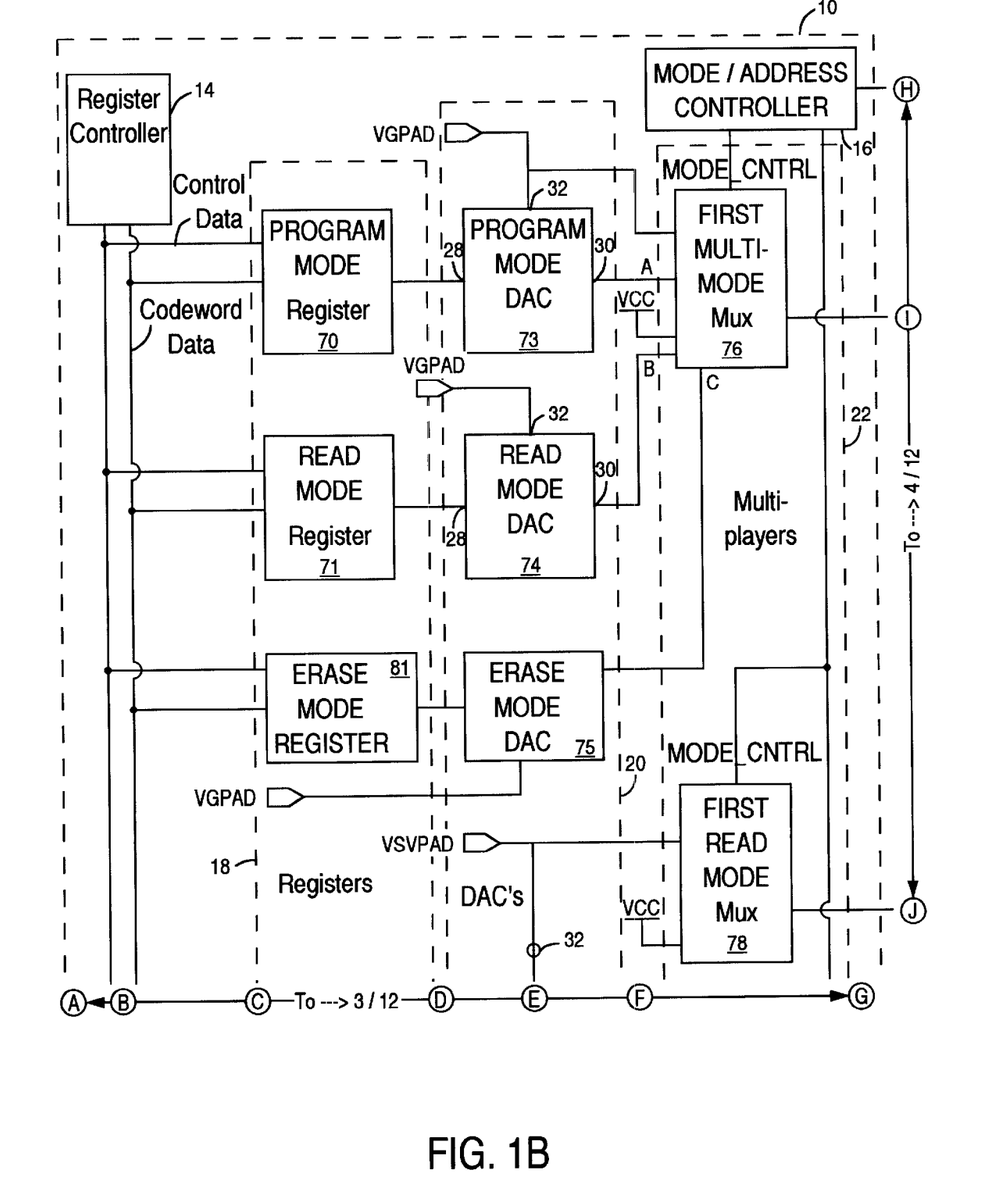
FIG. 1B is a detailed block diagram that shows a configuration of components that are suitable for practicing test system of FIG. 1A.

Now that the test system 10 has been generally described in conjunction with FIG. 1A, a more detailed description of the test system 10 follows in conjunction with FIG. 1B. FIG. 1B differentiates between the registers 18, the DAC's 20, and the multiplexers 22 based on their respective associations with corresponding modes of operation of the test system 10. The modes of the test system include an erase mode or first mode, a program mode or second mode, and a read mode or third mode. The first mode, the second mode, and the third mode may each entail distinct ranges of the output test voltages.

Each mode may have a different set of test output voltages that are suitable for application to the semiconductor memory device 12. As shown in FIG. 1B, the test output voltages may be a set composed of one or more of the following voltage levels: VG, VSV, VSG, and VD. VG is a gate voltage level for application to a gate of the semiconductor device during the read mode or the erase mode. VSV is a high voltage level, which drives the N-wells in a P-substrate in the multiplexers/decoders of the semiconductor device 12 to prevent the turning on of any unwanted junctions. VSG is an address decoder voltage for application to the semiconductor memory device 12 during the read mode. VD is a drain voltage that is applicable to the semiconductor device during the erase mode, the program mode, and the read mode.

A program mode register 70 handles codewords associated with the program mode. A read mode register 71 handles codewords associated with the read mode. An erase mode register 81 handles codewords associated with the erase mode. A multi-mode register 72 handles codewords associated with at least two of the program mode, the read mode, and the erase mode. The program mode register 70, the read mode register 71, and the erase mode register 81 may operate simultaneously for supporting the advanced storage of codewords for one or more upcoming modes, which follow a currently active mode.

A program mode register 70 feeds a program mode DAC 73. A read mode register 71 feeds a read mode DAC 74. An erase mode register 81 feeds an erase mode DAC 75. A multi-mode register 72 feeds a multi-mode DAC 75. The program mode DAC 73, the read mode DAC 74, and the erase mode DAC 75 may complete digital-to-analog conversions of codewords simultaneously and generally independently of one another. Accordingly, where the test system switches from one mode to another, an analog output voltage may be ready and waiting at the output of the applicable DAC among the DAC's 20. The overall test time can be reduced owing to the simultaneous and independent processing of the different DAC's 20, which cooperate to reduce the transition time between different modes.

A program mode DAC 73, a read mode DAC 74, and an erase mode DAC 75 are coupled to a first multi-mode multiplexer 76. A read mode DAC 74 is coupled to a first read mode multiplexer 78 and a second read mode multiplexer 79. A multimode DAC 75 is coupled to a second multi-mode multiplexer 80. The time lapse between shifting between any two sequential modes (e.g., the first mode and the second mode) is determined predominately by the switching time of the semiconductors of the multiplexer 22 after receiving a triggering signal (e.g., triggering edge of a pulse) from the mode/address controller 16.

In one embodiment, the first mode and the second mode represent different ranges of voltages for application to the semiconductor memory device 12 in a hot stand-by configuration such that a change only or predominately requires the activation of the multiplexer 22 to shift between the first mode and the second mode. Here, hot-standby means that while the test system 10 generates an actual test voltage for a prior mode; the test system 10 also generates preparatory voltage (e.g., precursor voltage) for a later mode following the prior mode in succession. The different DAC's 20 may simultaneously complete digital-to-analog conversions for successive modes to reduce or minimize the time necessary to switch between modes. The hot-standby operation of the test system 10 minimizes the time lapse from switching between any two successive modes, where the modes may occur in the sequence following sequence: first mode, second mode, and third mode. Further, one sequence may follow another to complete an accelerated life test of a semiconductor memory device 12.

The digital-to-analog converter 20 may include an input 28 and an output 30. The digital-to-analog converter includes a supply terminal 32 that may be coupled to a voltage, such as VGPAD, VSVPAD, VDPAD, or some other voltage level. VGPAD refers to a voltage level of a gate voltage pad or terminal. VDPAD refers to a voltage level of a drain voltage pad or terminal. VSV refers to an N-well voltage level in a P-substrate of a semiconductor memory device 12. VCC refers to a voltage level of a source supply voltage terminal. The values of VGPAD, VSVPAD, and VDPAD are preferably maintained at constant, regulated levels and may be independent of one another to avoid any delay that might otherwise be associated with changing the constant voltage level. In an alternate embodiment, the test system 10 may externally vary at least one of VGPAD, VSVPAD, and VDPAD to provide additional variation in the applied test voltages to the semiconductor memory device 12.

The semiconductor memory device 12 may comprise a flash memory. In one embodiment, the flash memory has the following input terminals, VG, VSV, VSG, and VD. VG is a gate input terminal. VD is a drain input terminal that feeds a column of the memory as shown in FIG. 1. VSG is a gate terminal that feeds an address decoder 24. VSV is a supply terminal associated with an N well of a P substrate semiconductor device, for example. BSP and BSG are voltage levels associated with column 1 and column 2, respectively, of the semiconductor memory device 12.

The semiconductor memory device 12 has a gate input (VG), a high voltage N-well input (for a P-type substrate, VSV), a column select decoding input (VSG) and a drain input (VD). The voltage levels applied to the semiconductor memory device 12 involve varying the source and drain voltages to evaluate the performance of the semiconductor memory device 12. In accordance with the invention, the test system 10 has a first mode during which erase voltage levels are applied to the semiconductor memory device 12 (e.g., flash memory), a second mode during which program voltage levels are applied to the semiconductor memory device 12, and a third mode during which read voltage levels are applied to the semiconductor device 12. In preparation for the first mode, the load controller 14 contains a first array of bits representing voltage levels for erasure levels of VG, VSV, VSG, and VD for transmission to the registers 18. In preparation for the second mode, the load controller 14 contains a second array of bits representing voltage levels for program levels or write or program levels of VG, VSV, VSG, and VD. In preparation for the third mode, the load controller 14 contains a third array of bits representing voltage levels for read levels or verify levels of VG, VSV, VSG, and VD. The load controller 14 may issue commands to the registers 18 to reset, program load, read load, select register load, register load, and negative voltage register load, or the like. The commands may be indicated by unique combinations of bit values in a 3 bit word or in accordance with some other command designator.

In an illustrative example of the invention, the first mode (e.g., erase mode) has a voltage range of approximately negative 5 volts direct current (VDC) to approximately negative 9.5 VDC. The second mode (e.g., program mode) has a voltage range of approximately positive 5 volts direct current (VDC) to approximately positive 9.5 VDC for a field effect semiconductor device. The third mode (e.g., read mode) has a voltage range of approximately positive 3 VDC to approximately positive 6 VDC. The resolution or granularity of the voltage steps within the range depends upon the storage capacity of the registers 18. For example, if the register 18 can store four bits, sixteen different bit combinations may represent sixteen different power levels.

In accordance with one illustrative embodiment of the invention, a typical total cycle duration would take about 200 milliseconds to complete, where the time interval between the transition between the program mode and the read mode approaches a time interval of zero seconds. Further, the combination of the erase mode and the program mode may contribute approximately ninety-five percent of the cycle time (e.g., 190 milliseconds), while the read mode would contribute toward the remainder.

Although the semiconductor memory device 12 shows only one memory cell 26 to simplify the explanation of the invention, in practice the memory device may include many memory cells. The memory cells 26 are arranged into rows and columns. A memory cell 26 may be located at the intersection of each row and column. The semiconductor memory device 12 includes a group of column decoder transistors 27 to support the memory cell 26.

An address decoder 24 controls the selection of a memory cell by transmitting an appropriate signal on a selected row and a selected column. The address decoder 24 may represent a switching matrix that applies the voltage VSG, VCC, or a derivative of the foregoing voltages, to a selected row and a selected column to select a memory cell. The states of the switching matrix are controlled by the mode/address controller 16.

Figure 2:
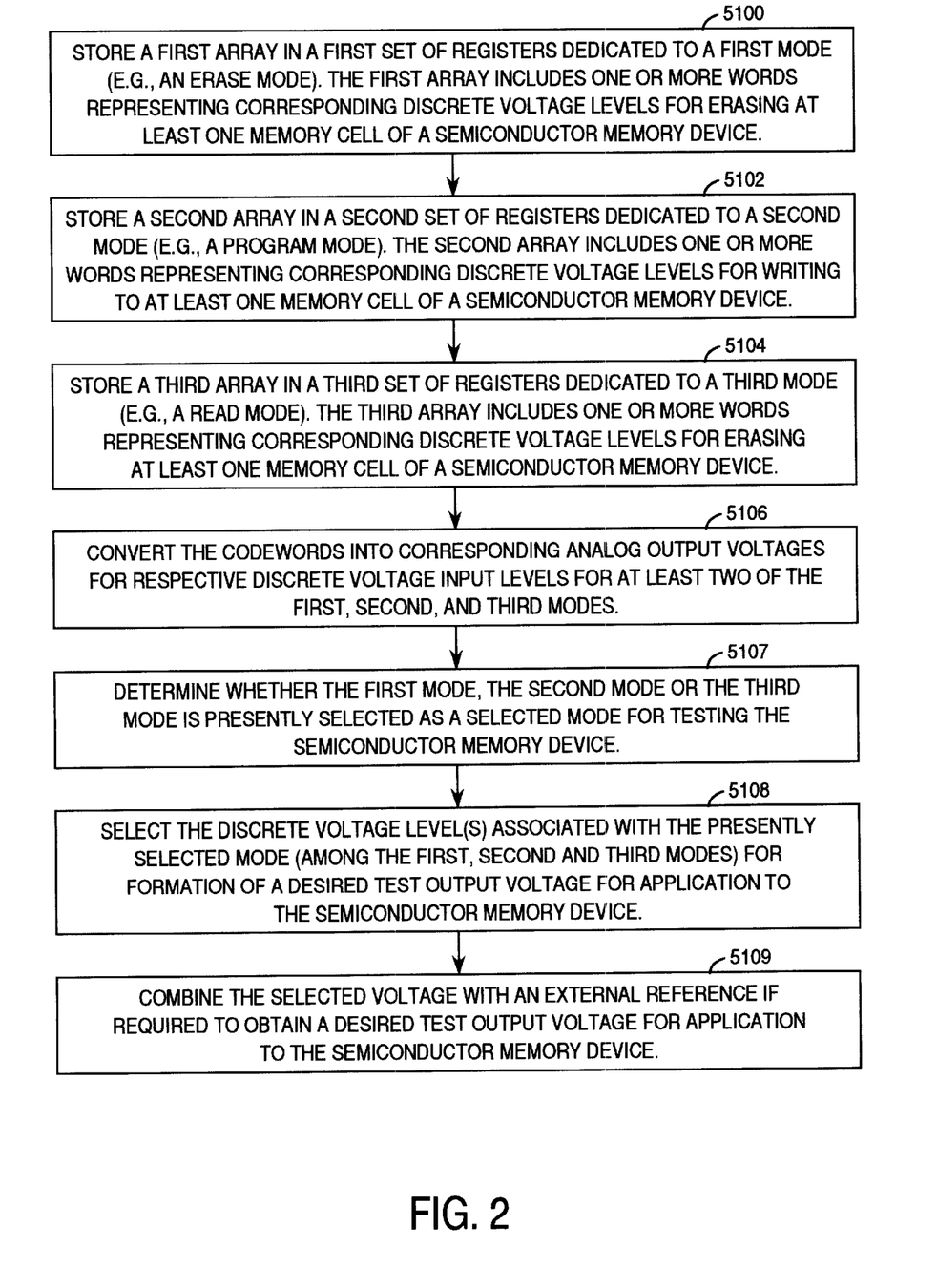
FIG. 2 is a flow chart of a method for testing a semiconductor device in accordance with the invention.

FIG. 2 is a flow chart of a method of testing a semiconductor memory device 12 in accordance with the invention. The method starts with step S10.

In step S100, the test system 10 stores and holds a first array in a first set of registers 18 (e.g., erase mode register 81). The first set of registers 18 is dedicated to a first mode (e.g., an erase mode) of a semiconductor memory device 12. The first array includes one or more codewords representing a corresponding discrete voltage level or levels for erasing at least one memory cell 26 of a semiconductor memory device 12.

In step S102, the test system 10 stores and holds a second array in a second set of registers 18 (e.g., program mode register 70). The second set of registers 18 may be dedicated to a second mode (e.g., a program mode). The second array includes one or more words representing corresponding discrete voltage levels for writing to at least one memory cell 26 of a semiconductor memory device 12.

In step S104, the test system 10 stores and holds a third array in a third set of registers 18 (e.g., read mode register). The third array includes one or more words representing corresponding discrete voltage levels for reading at least one memory cell 26 of a semiconductor memory device 12.

Steps S100, S102 and S104 may be completed simultaneously or in any other suitable order so long as the correct mode sequence of erasure, programming, and reading is followed later. The first set includes at least one register 18 and the second set includes at least one register 18. Each register 18 has a maximum storage capacity, which may defined in terms of the number of bits, bytes, or words the register 18 can store. Although the registers 18 may have virtually any feasible maximum storage capacity, as shown in FIG. 1, the maximum storage capacity of each register 18 may be six bits. Six bits provides at least sixty-four corresponding discrete voltage levels that may be used to form the test output voltage. The resolution of the discrete voltage levels represented by the codeword is limited by the maximum storage capacity of the register 18. Each register 18 may store and hold a value within the storage capacity until the load controller 14 loads a new value that replaces or pushes out the previous value. In one embodiment, the load controller 14 may provide a sequence of discrete voltage levels that stress the semiconductor memory device 12 in a desired manner.

In step S106, the test system 10 or the digital-to-analog converters 20 convert (e.g., simultaneously convert) the codewords into corresponding analog output voltages for respective discrete voltage input levels for at least two of the first mode, the second mode, and the third mode. In one example, a first set of digital-to-analog converters 20 (e.g., erase mode DAC 75) accepts one or more codewords in the associated first set of registers 18 (e.g., erase mode register 81) and converts the codewords from digital values to analog voltages for the first mode. A second set of digital-to-analog converters 20 (e.g., program mode DAC 73) accepts codewords in the associated second set of registers 18 (e.g., program mode register 70) and converts the codewords from digital values to analog voltages for the second mode. A third set of digital-to-analog converters 20 (e.g., read mode DAC's 74) accepts codewords in the associated third set of registers 18 (e.g., read mode registers 71) and converts the codewords from digital values to analog voltages for the third mode.

In step S107, the test system 10 or the mode/address controller 16 determines whether the first mode, the second mode or the third mode is presently selected as a selected mode for testing the semiconductor memory device 12.

In step S108, the test system 10 or at least one multiplexer 22 selects the discrete voltage levels for output. The selected discrete voltage levels are associated with the presently selected mode (among the first, second, and third modes) for formation of a desired test output voltage for application to the semiconductor memory device 12. For example, the multiplexer 22 interconnects its output terminal with a first input terminal, a second input terminal, or another input terminal of the multiplexer 22 to output the desired test output voltage.

In step S110, the test system 10 or the at least one high voltage multiplexer 22 combines the selected voltage with an external reference if required to obtain a desired test output voltage for application to the semiconductor memory device 12. The multiplexer 22 may act as a switch to connect an analog voltage within a first voltage range from a first set of digital-to-analog converters 20 to the an output terminal of the multiplexer 22. The inputs to the multiplexer 22 are analog voltages. The mode/address controller 16 determines the input-output terminal combination that the multiplexer 22 uses. The multiplexer 22 may also use the externally supplied voltages VDPAD, VSVPAD and VGPAD and VCC as inputs to additional input terminals to provide a desired output voltage through control of the mode/address controller 16. Accordingly, the foregoing externally supplied voltages are appropriately filtered and regulated to be consistent with the resolution of the registers 18 and the digital-to-analog converters 20.

In one example, the read mode, the program mode, the read mode and the erase mode are executed in sequence and the duration of the sequence is referred to as a total test cycle duration. The transition interval between the first mode and the second mode is minimized and preferably approaches zero to reduce the duration of the total test cycle duration. Similarly, the transition interval between the second mode and the third mode is minimized and preferably approaches zero to reduce the duration of the total test cycle duration.

FIG. 3 shows an illustrative example of a digital-to-analog converter (20 or 74) that may be used in the test system 10 of FIG. 1A and FIG. 1B, although another digital-to-analog converter 20 may be used to practice the invention. In particular, the digital-to-analog converter of FIG. 3 is well-suited for employment as the read mode DAC 74.

The digital to analog converter includes a input switches 40 coupled to a resistive network 42, a comparator 44 coupled to an output of the resistive network 42, a feedback path from an output of the comparator 44 to the input, and output switches 46.

The input switches 40 receive digital logic inputs. For example, an input switch 40 may be turned off in response the application of a low logic level and turned on in response to the application of a high logic level. If an input switch 40 is turned on, the input switch changes (e.g., reduces) the total resistance of the resistive network 42. The amount of the change (e.g., reduction) of the resistive network 42 depends upon which bit of a word inputted into the input switches 40 has a high logic level, as opposed to a low logic level. Accordingly, the output voltage of the resistive network 42 depends upon the states of the input switches 40, which in turn depend upon the logical values of the input codeword from the registers 18.

The values of individual resistors of the resistive network 42 may be selected such that a resistor is associated with a corresponding bit position (e.g., least significant bit or the most significant bit) within a word. Each bit position may be affiliated with a resistance of a resistor that is approximately a multiple integer of other resistances of other resistors of the resistive network 42.

The output of the resistive network 42 is inputted into a comparator 44. The comparator 44 may provide an analog output voltage or an analog output current that is proportional to the input voltage provided by the resistive network 42 in cooperation with the input switches 40. For example, if the comparator 44 is configured as a transconductance amplifier the input voltage is converted to a corresponding output current.

A series output capacitor 54 is connected to an output of the comparator 44 to stabilize the output node. The output capacitor 56 is connected to ground. The output capacitor 56 shorts alternating current to ground to prevent unwanted oscillation in the analog output voltage A resistive load or a field effect transistor arranged to provide a resistive load may be placed between the comparator 44 output and other output switches 46 that are switchable to ground. The output switches 46 may represent field effect transistors (e.g., power field effect transistors) that are cascaded with respect to their drain-source electrical paths.

The output switches 46 may be used as a current limiter to limit the analog output current and as a logical AND gate. For example, if the output switches 46 include a first switch, a second switch, and a third switch as shown, all of the switches must be in an active state to realize a connection of the resistive load to ground. In FIG. 3, the output switches 46 are turned on by application of the appropriate voltage to gates of the output switches 46. The gates of the output switches 46 are coupled to the output of the comparator 44, the power supply (VCC) and RDREG. RDREG refers to a voltage level that is regulated and may be derived from the output of a register 18.

The digital-to-analog converter 20 may also include a control circuit 52 for controlling operation of the digital-to-analog converter 20. The control circuit 52 may be coupled to the resistive network 42, the comparator 44, and the output switches 46. The control circuit 52 may include a group of field-effect transistor switches 60 that are turned on or off by a master integrated circuit switch 62. As shown in FIG. 3, the master integrated circuit switch 62 is responsive to the voltage level of the signals RDREG and VSVPAD. When turned on, the field effect transistor switches 60 may apply VSVPAD to the output of the comparator 44 and VCC to the feedback path 48. Further, the output of the comparator 44 may trigger the turning on of a field effect transistor switch 60 that applies VGPAD to feedback resistor 50.

In an alternative embodiment of the digital-to-analog converter 20, the voltage levels applied to the input of the comparator 44, the input of the master integrated circuit switch 62, a gate of one of the output switches 46, a ground connecting switch 59 associated with the resistive network 42, or elsewhere may be modified by the inclusion of at least one logic circuit to produce the desired control of the digital-to-analog conversion process in cooperation with the rest of the test system 10. For example, the logic circuit may represent an OR gate, in which the input of the OR gate is RDREG and READ, where read is a value that indicates whether the test system is in the read mode or not at any given time. The output of the OR gate is applied to the input of the comparator 44, the input of the master integrated circuit switch 62, a gate of one of the output switches 46, a ground connecting switch 59 associated with the resistive network 42 or elsewhere.

The foregoing digital-to-analog converter 20 of FIG. 3 provides a sufficiently rapid response time in the conversion process. Although the digital-to-analog converter 20 is configured for the conversion of 6-bit words, into an analog output signal, in alternate embodiments, the digital to analog converter may be configured to handle words with more or less than 6 bits. The only limitation on the maximum number of bits is the ratio of the value of the least significant bit resistor to the most significant bit resistor may become impractical. The accuracy or precision of the digital-to-analog converter 20 may be sacrificed for speed or response time to the extent that the analog output values fall within the parameters of the tested semiconductor memory device 12 to support proper writing and read verification of the tested semiconductor memory device 12. Therefore, the above digital-to-analog converter may offer an advantage over commercially available devices in that the balance between speed and accuracy may be optimized to meet the specific test conditions of the semiconductor memory devices at hand.

Figure 4:
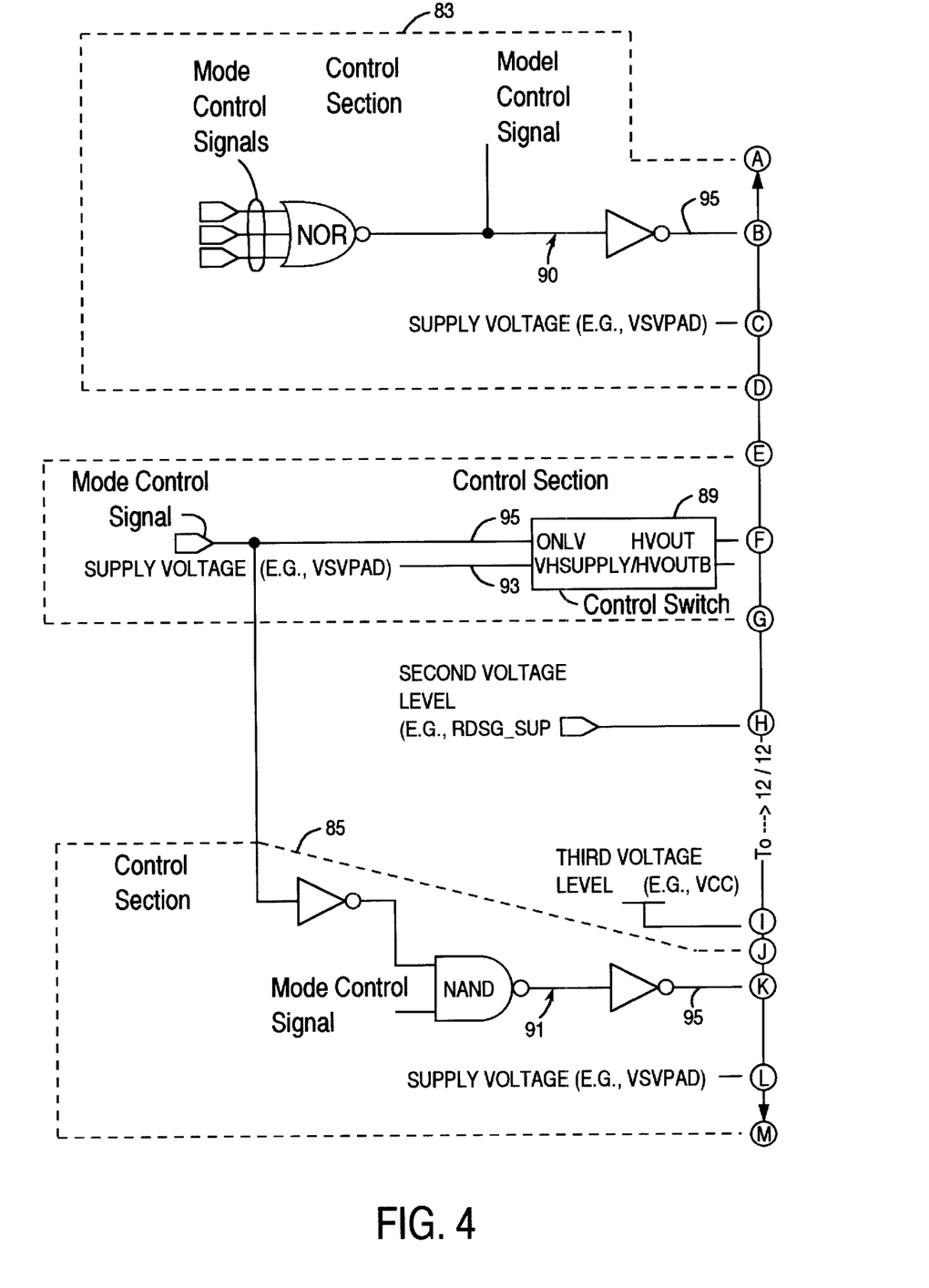
FIG. 4 is a schematic diagram of an illustrative multiplexer that may be used in the test system of FIG. 1A and FIG. 1B.

FIG. 4 shows an illustrative embodiment of a high voltage multiplexer (22 or 79) which may be used in the test system 10 of FIG. 1. Although the multiplexer of FIG. 4 may be configured or modified to be used as any multiplexer of FIG. 1B, the multiplexer is well-suited for operation as the second read mode multiplexer 79.

Although the high voltage multiplexer 22 may includes as few as two control sections associated with corresponding switches, as shown in FIG. 4 the voltage multiplexer includes three control sections (83, 84, 85) associated with corresponding semiconductor switches (82, 86, 87). Each of the control sections may include a logic circuit, such as an arrangement of gates (90, 91), for controlling the states of the corresponding switch (82, 86).

Each control section (83, 84, 85) includes a control switch 89 which may be affiliated with logic gates of a logic circuit. Each control switch 89 has a first input terminal 93 that is connected to a supply voltage and a second input terminal 95 that is used to control an output of the control switch 89. The mode controller 16 inputs mode control signals to the control sections (83, 84, 85) including the logic circuit (90, 91), the control switches 89, or both. The output of each control switch 89 is connected to feed the gate or control input of the semiconductor switches (82, 86, 87).

If the switch (82, 86, or 87) is in an active state, the switch may pass, or derive, a desired voltage level to an output of the high voltage multiplexer 22. As illustrated in FIG. 4, the desired voltage levels are referenced as the first voltage level (e.g., VSVPAD), the second voltage level (e.g., RDSG_SUP), and the third voltage level (e.g., VCC). If a switch (82, 86, or 87) is in an inactive state, the switch presents a high impedance (e.g., approaching an open circuit) to the output of the voltage multiplexer 22. The control sections (83, 84, 85) may cooperate with the corresponding semiconductor switches (82, 86, 87) such that only one of the first voltage level, the second voltage level, and the third voltage level is present as an output voltage level at the output port at any given time. The control sections (83, 84, 85) are preferably coordinated such that only one switch out of all of the corresponding switches is active at one time to maintain an appropriate voltage level at the output of the high voltage multiplexer 22.

The digital to analog converter of FIG. 3 and the multiplexer of FIG. 4 are merely illustrative examples of many possible analog converters and multiplexers that may be used to practice the invention. In practice, the multiplexers in the same test system 10 may differ in design from multiplexer-to-multiplexer as is known to those of skill in the art. Similarly, the digital-to-analog converters (DAC's) in the same test system may differ in design from DAC-to-DAC as is known to those of skill in the art.

The foregoing description of the method and system describes several illustrative examples of the invention. Modifications, alternative arrangements, and variations of these illustrative examples are possible and may fall within the scope of the invention. Accordingly, the following claims should be accorded the reasonably broadest interpretation, which is consistent with the specification disclosed herein and not unduly limited by aspects of the preferred embodiments disclosed herein.

The following is claimed:

1. A system for testing a semiconductor memory device, the system comprising:

a plurality of registers for storing codes, where each code represents a discrete voltage level, the registers having inputs and outputs, a plurality of digital-to-analog converters coupled to the outputs of the registers for converting the discrete voltage level into an analog voltage;

a multiplexer for deriving a test output voltage from at least one of the analog voltage and an external voltage, the multiplexer comprising an input and an output; and a mode controller for selecting between or among multiple modes, wherein each mode defines a different voltage range of the test output voltage, the mode controller receiving the output of the multiplexer.

2. The system according to claim 1 wherein the modes include a first mode, a second mode, and a third mode, the digital-to-analog converters supporting simultaneous conversion of the discrete voltage levels associated with at least two of the modes to minimize the transition time for switching between successive modes.

3. The system according to claim 2 wherein the first mode comprises an erase mode for erasing at least one memory cell of the semiconductor memory device, wherein the second mode comprises a program mode for writing to at least one selected memory cell of the semiconductor device, and wherein the third mode comprises a read mode for verifying the writing to the at least one selected memory cell.

4. The system according to claim 1 wherein the modes include a first mode and a second mode, the first mode representing an erase mode of the semiconductor memory device and the second mode representing a program mode of the semiconductor memory device, a time lapse between shifting from the first mode to the second mode determined predominately by a switching time of the multiplexer after receiving a triggering signal from the mode controller.

5. The system according to claim 1 wherein the modes include a second mode and a third mode, the second mode representing a program mode of the semiconductor memory device and the third mode representing a read mode of the semiconductor memory device, a time lapse between shifting from the second mode to the third mode determined predominately by a switching time of the multiplexer after receiving a triggering signal from the mode controller.

6. The system according to claim 1 further comprising a register controller for controlling the loading of the codes into the inputs of the corresponding registers.

7. The system according to claim 1 further comprising a register controller programmed to provide a sequence of the codes to a register of the plurality of registers for transmission to a corresponding digital-to-analog converter of the plurality of digital-to-analog converters, the codes representing discrete voltage levels conforming to a minimum voltage step-size determined by a data capacity of the register.

8. The system according to claim 7 wherein the register controller is adapted to change the test voltage output from one voltage step to another within a single mode during as little as approximately two hundred nanoseconds.

9. The system according to claim 1 wherein the registers include a program mode register, an erase mode register, a read mode register, and multi-mode register to permit simultaneous loading of the registers, associated with different modes, during a prior mode to prepare for a transition to a subsequent mode.

10. The system according to claim 1 wherein the digital-to-analog converters include a program mode digital-to-analog converter, an erase mode digital-to-analog converter, a read mode digital-to-analog converter, and multimode digital-to-analog converter to permit simultaneous operation of the digital-to-analog converters, associated with different modes, during a prior mode to prepare for a transition to a subsequent mode.

11. A method for testing a semiconductor memory device, the method comprising the steps of:

storing codes in a plurality of registers, where each code represents a discrete voltage level, the registers having inputs and outputs, converting the outputs of the registers from the discrete voltage level into an analog voltage;

deriving a test output voltage from at least one of the analog voltage and an external voltage; and selecting between or among multiple modes based on the test output voltage, each mode defining a different voltage range of the test output voltage.

12. The method according to claim 11 wherein the selecting step comprises selecting among a first mode, a second mode, and a third mode as the multiple modes, the converting step supporting simultaneous conversion of the discrete voltage levels associated with at least two of the multiple modes to minimize the transition time for switching between successive modes.

13. The method according to claim 12 wherein the first mode comprises an erase mode for erasing at least one memory cell of the semiconductor memory device, wherein the second mode comprises a program mode for writing to at least one selected memory cell of the semiconductor device, and wherein the third mode comprises a read mode for verifying the writing to the at least one selected memory cell.

14. The method according to claim 11 wherein the selecting step includes shifting between a first mode and a second mode, among the multiple modes, a time lapse associated with the shifting determined predominately by the deriving of the test output voltage, the first mode representing an erase mode of the semiconductor memory device and the second mode representing a program mode of the semiconductor memory device.

15. The method according to claim 11 wherein the step includes shifting between a second mode and a third mode, among the multiple modes, a time lapse associated with the shifting between the second mode to the third mode determined predominately during the deriving of the output test voltage, the second mode representing a program mode of the semiconductor memory device and the third mode representing a read mode of the semiconductor memory device.

16. The method according to claim 11 further comprising the step of controlling loading of the codes into the inputs of the corresponding registers.

17. The method according to claim 11 further comprising the step of providing a sequence of codes representing discrete voltage levels for the storing of the codes and the conversion of the codes into analog voltages, the discrete voltages conforming to a minimum voltage step-size.

18. The method according to claim 17 further comprising the step of changing the test voltage output from one voltage step to another within a single mode during as few as approximately two hundred nanoseconds.

19. The method according to claim 11 wherein the storing of codes includes storing codes simultaneously for different modes, during a prior mode to prepare for a transition to a subsequent mode.

20. The method according to claim 11 wherein the converting step includes converting codes simultaneously for different modes, during a prior mode to prepare for a transition to a subsequent mode.

* * * * *